United States Patent
Ryder et al.

(10) Patent No.: US 6,864,678 B2
(45) Date of Patent: Mar. 8, 2005

(54) NESTLESS PLUNGE MECHANISM FOR SEMICONDUCTOR TESTING

(75) Inventors: Charlie Ryder, Walpole, MA (US); John A. Heald, Billerica, MA (US); Robert Hennessey, East Walpole, MA (US)

(73) Assignee: Delta Design, Inc., Littleton, MA (US)

( * ) Notice: Subject to any disclaimer, the term of this patent is extended or adjusted under 35 U.S.C. 154(b) by 3 days.

(21) Appl. No.: 10/621,955

(22) Filed: Jul. 16, 2003

(65) Prior Publication Data

US 2004/0051543 A1 Mar. 18, 2004

Related U.S. Application Data

(60) Provisional application No. 60/396,643, filed on Jul. 17, 2002.

(51) Int. Cl.[7] .............................................. G01R 31/02
(52) U.S. Cl. .................................... 324/158.1; 758/765
(58) Field of Search ................................ 324/754–755, 324/758, 761, 765, 158.1; 414/627, 752.1, 788.7, 796.9, 797

(56) References Cited

U.S. PATENT DOCUMENTS

| | | | |
|---|---|---|---|
| 4,115,736 A | 9/1978 | Tracy | 324/158 |
| 4,138,186 A | 2/1979 | Long et al. | 339/117 |
| 4,322,682 A | 3/1982 | Schadwill | 324/158 |
| 4,518,914 A | 5/1985 | Okubo et al. | 324/158 |
| 4,538,104 A | 8/1985 | Douglas et al. | 324/158 |
| 4,694,245 A | 9/1987 | Frommes | 324/158 |
| 4,723,361 A | 2/1988 | Carlson et al. | 29/764 |
| 4,771,234 A | 9/1988 | Cook et al. | 324/158 |
| 4,869,636 A | 9/1989 | Reid et al. | 414/331 |
| 5,027,063 A | 6/1991 | Letourneau | 324/158 |
| 5,124,644 A | 6/1992 | Ganapol | |
| 5,192,908 A | 3/1993 | Shibata | 324/158 |
| 5,198,753 A | 3/1993 | Hamburgen | 324/158 |
| 5,200,694 A | 4/1993 | Nesbitt et al. | 324/158 |
| 5,254,942 A | 10/1993 | D'Souza et al. | 324/158 |
| 5,376,882 A | 12/1994 | Johnson | 324/158.1 |
| 5,481,202 A | 1/1996 | Frye, Jr. | 324/754 |
| 5,519,332 A | 5/1996 | Wood et al. | |
| 5,557,211 A | 9/1996 | Ferrer et al. | 324/754 |
| 5,708,222 A | 1/1998 | Yonezawa et al. | |
| 5,731,708 A | 3/1998 | Sobhani | 324/758 |
| 5,969,537 A | 10/1999 | Kanno et al. | 324/760 |
| 6,005,405 A | 12/1999 | Slutz | 324/761 |
| 6,104,204 A * | 8/2000 | Hayama et al. | 324/760 |
| 6,137,286 A * | 10/2000 | Ho et al. | 324/158.1 |
| 6,211,960 B1 | 4/2001 | Hembree | 356/400 |
| 6,344,737 B1 | 2/2002 | Yap et al. | 324/158.1 |

* cited by examiner

*Primary Examiner*—Minh N. Tang
(74) *Attorney, Agent, or Firm*—Peter J. Manus; Edwards & Angell, LLP (57) ABSTRACT

A plunge mechanism includes an elongated, hollow probe that vacuum grips at its free end, and carries, without relative movement therebetween, an electronic device under test (DUT) to a test site on a board, or socket, of a test circuit. A reciprocating drive plunges the DUT in a first direction to a test site where the leads of the DUT each align with and connect electrically to an associated electrical contact. The drive uses a high-precision linear slide to maintain the alignment of the probe with the test site during the plunging movement. The probe materials and dimensions provide sufficient stiffness to resist a shift of the IC out of alignment due to the weight of the gripped DUT, vibrations, or contact forces between the DUT and the board or socket. The diameter of the probe is preferably smaller than the x–y dimensions of the DUT. No DUT alignment members are used on the test board or socket that limit the physical proximity of the DUT to its preferred test position with respect to the test circuit.

9 Claims, 4 Drawing Sheets

NESTLESS PLUNGE MECHANISM FOR SEMICONDUCTOR TESTING

CROSS REFERENCE TO RELATED APPLCATIONS

This application claims the benefit of U.S. provisional application No. 60/396,643 filed on Jul. 17, 2002.

BACKGROUND OF THE INVENTION

This invention relates to high speed automated testing of electronic devices such as integrated circuits. More particularly, it relates to a nestless linear transport that grips and plunges a device to be tested onto a test circuit board or socket while maintaining alignment of the device leads to the respective test connectors of the circuit.

In the manufacture of electronic components, such as integrated circuits ("IC's"), it is necessary to test the completed IC before shipment and/or before assembly into a product, e.g. a printed circuit board used in a computer or consumer electronics product. Production economics require that the test be reliable and performed with a high throughput rate.

Typically the devices are stored and tested in specialized containers such as elongated plastic tubes ("sticks") arranged on trays, or held in sockets or other fixtures. For testing, the devices are fed to a test site where they are presented to a test fixture, such as a socket or contactor assembly, which in turn has a set of electrical contacts that make electrical connection between the device under test ("DUT") and a test circuit. The device can be moved to the fixture, or the reverse. Common architectures for handling the DUT's include pick and place apparatus and gravity feed apparatus. A typical gravity feed test handler 12' (shown in FIGS. 1A and 1B) unloads devices from a "stick" to a vertical test track 14' where they fall, in succession, to a test site 16' defined by a set of movable pins or equivalent stop members that selectively projects into and is then withdrawn from the track. A transport, here a plunge mechanism 10', then grips the DUT at the test site 16', carries it to the test circuit 18', and drives its leads into engagement with the contacts of the test circuit. The test is performed, and then the device is returned to the test site position and released to one of several output tracks depending on the results of the test. The plunger is then positioned to grip and transport the next DUT in another cycle of operation.

The devices are often small. The leads can bend out of position or be misformed or mispositioned. Contaminants such as oxides can coat the leads and degrade the quality of the electrical connection. Many modem devices are "small outline ("SO") chips where the electrical lead or pad is flush with the plastic or ceramic body of the device ("leadless"). To ensure a good electrical connection, usually a spring or other engagement force and/or a wiping engagement between the lead and the contact, are used. The drive force of the transport also promotes the quality of the electrical connection. A reliable, accurate alignment of the DUT with respect to the test circuit contacts is important not only to establish a good electrical connection at each connection, but also to control cross talk between adjacent pins.

For radio frequency ("RF") devices, high-speed memory chips, and others, the physical location of the DUT with respect to its test circuit is important. With high-speed devices, for example, the test signals are extremely fast rising. That creates inductance problems in all but very short transmission lines. Close physical proximity of the DUT to the test circuit, thus simulating the actual end-use environment, decreases the test time and increases the reliability of the test. An on-going design problem in high-speed, automated testing of many modem devices is the trade-off between 1) the need to place the DUT into a test circuit with close proximity to other circuit elements and simulating as closely as possible the actual end-use operating environment, and 2) the need to move the DUT to this location while at the same time aligning its leads with associated connectors as the test circuit (e.g., a p.c. board) or a test socket or contactor assembly mounted on and connected to the test circuit board.

One known solution has been to grip a DUT, but to do so "lightly", allowing movement of the DUT as it engages the test fixture or site. Fixed guide or cam surfaces then "steer" the DUT into the correct alignment for test connections. Projecting locator pins are also widely used to align, and then secure an alignment of, a DUT, or a socket or a tray holding a DUT in a known location and orientation. These pins and surfaces, however, take up space at the test site. In particular, they are near the DUT, and create a "keep out" area around the DUT that spaces test circuit components from the DUT when it is connected.

Vacuum suction gripping is also known, e.g., to pick and place a DUT or DUT's, as well as to hold a device, test fixture, or other components. U.S. Pat. No. 5,344,737 is a recent example of vacuum suction used to secure components in IC fabrication. U.S. Pat. No. 6,211,960 is another recent example where vacuum suction is used as an element of an apparatus that aligns and connects objects such as semiconductor components and substrates. In the '960 patent, a set of actuators guided by a vision control system, locate and orient an object on a moving platform with multiple degrees of freedom of motion.

In the context of a plunge-type presentation of the DUT, it is known to use a "nest", that is, a frame of an insulating, usually elastomeric, static dissipative material that surrounds and is closely spaced from the DUT. In one form, a small rectangular frame of an elastomer is secured on the test board around the test site. A rigid frame piece overlies the elastomer and secures its location. The DUT is gripped and plunged through this frame and the nest, which guide the DUT into alignment, and reject any grossly misaligned DUT's that approach the test site. It is also known to mount a nest such as nest 22 (FIGS. 1A and 1B) on a plunge mechanism in order to frame the DUT in a desired position and to interact with a test site to guide and align the DUT. The nest typically includes holes that engage locator pins on the test circuit board or a test socket to establish and maintain the proper alignment between the DUT and connectors of the test circuit or socket. While such nested arrangements can perform well in certain applications, the DUT cannot be in close physical proximity to the circuit and adjacent components of the circuit as required for the testing of many devices such as the RF chips mentioned above.

It is therefore an object of the invention to provide a nestless plunge apparatus and method that transports IC's and the like to a test site and provides the requisite degree of reliability of alignment and electrical connection to the test circuit while also placing substantially no restrictions on the proximity of the device to the test circuit.

Another object is to provide the foregoing advantages with reliability.

A further object is to provide the foregoing advantages in a variety of handler environments.

Still another object is to provide the foregoing advantages as well as convenient adjustability to handle and test devices of different sizes and types, and is especially well suited to test small leadless IC device packages.

SUMMARY OF THE INVENTION

A test-handler for semiconductor devices, especially IC's, uses a nestless plunge mechanism to grip and carry a device under test (DUT) to a test site where it is momentarily pressed into electrical connection with a test circuit, and tested. In one form, the devices fall along a vertical track under gravity feed to a test pick-off point defined by a set of movable stop pins or the like. The pins project into the track to arrest the fall of the lead device at a well-defined location and spatial orientation. The plunge mechanism grips the DUT, plunges it to the test site, and returns the tested device back to its initial position where it is sorted in accordance with the test results.

The nestless plunge mechanism of this invention uses an elongated probe that grips the DUT at its free end tip with a vacuum suction. The probe preferably has a central passage that connects a vacuum source to the opening at the probe tip where it can act on the device. A drive assembly produces a linear, reciprocating movement of the probe and the DUT vacuum-gripped at its tip.

In one form, a combined pneumatic/servomotor actuator is the motive power source of the drive. In a retracted limit position, the probe tip is positioned adjacent a DUT at the pick-up (or test) point. When the DUT is at rest and in a well-defined location and orientation, the probe advances to the rear face of the device, and the vacuum at its tip grips the device with sufficient force to secure that location and orientation.

Once the DUT is gripped, the drive assembly plunges the probe and the DUT at its tip forward to a test limit position where the DUT connects to the test circuit. This movement is without vibration or a deflection of the long, thin probe due to the weight of the DUT or the contact force of the DUT with connections or other parts of the test found on a test socket. The driving force for typical IC applications is in the range of 8 to 20 pounds to ensure a seating of the DUT with good electrical connections. This plunge movement to the forward limit position is also made with the DUT retaining its initial position that is aligned with the test site to place each lead on the DUT into electrical connection with a correct connector to avoid misconnections and cross talk between pins. The degree of precision required will vary with the application, but typically leads are a few millimeters wide with a like close spacing, so the alignment could have a comparable level of precision with high reliability.

For the testing of common IC's, a vacuum about 22 inches of mercury will reliably hold the DUT. The probe body can be formed from a hypodermic needle stock of 300 series stainless steel, but the probe tip is non-metallic, and preferably a static dissipating material. The tip is adhered to the stainless steel body.

The x-y or lateral dimensions of the probe (in a plane orthogonal to the direction of the plunge movement and the probe itself) are preferably less than the footprint of the DUT, viewed along the direction of the plunge movement. The resulting small profile on presentation—no more than that of the DUT itself—combined with a well-controlled, plunge movement in the z direction (onto the test site), allows the testing to be conducted in a test circuit, (or a socket on a circuit board that itself closely surrounds the DUT when it is connected to the socket) with extremely close physical proximity of the DUT to the circuit. The "keep out" area is negligible and the test approximates end-use conditions while being made at a speed (e.g. 100 milliseconds) favorable for current production economics.

Viewed as a process, the invention can be defined as locating a DUT at a test station so that leads of the DUT are in alignment with corresponding connectors at a test site, providing an elongated probe vacuum suction gripping a DUT at a face end of the probe with sufficient force to secure the position and orientation of the DUT with respect to the probe, driving the probe with the DUT gripped along the direction of the probe and its electrical connection with the connectors of the test site, said driving retaining the alignment between the DUT and the test site established before said drive to a test circuit, and resisting lateral deformation or vibration of the probe and the gripped DUT during said driving.

These and other features and objects of the invention will be more fully understood from the following detailed description which should be read in light of the accompanying drawings.

DETAILED DESCRIPTION OF THE INVENTION

Figure 1A:
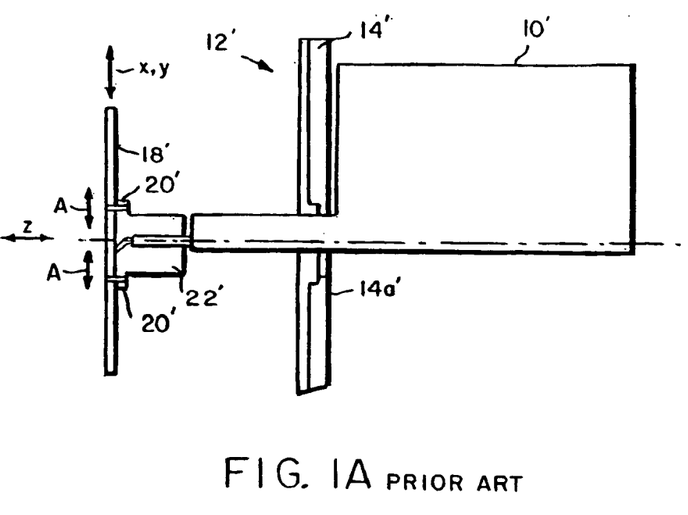
FIG. 1 is a simplified view in side elevation of a prior art nested plunge mechanism operating in a vertical-track, gravity feed test-handler.
Figure 1B:
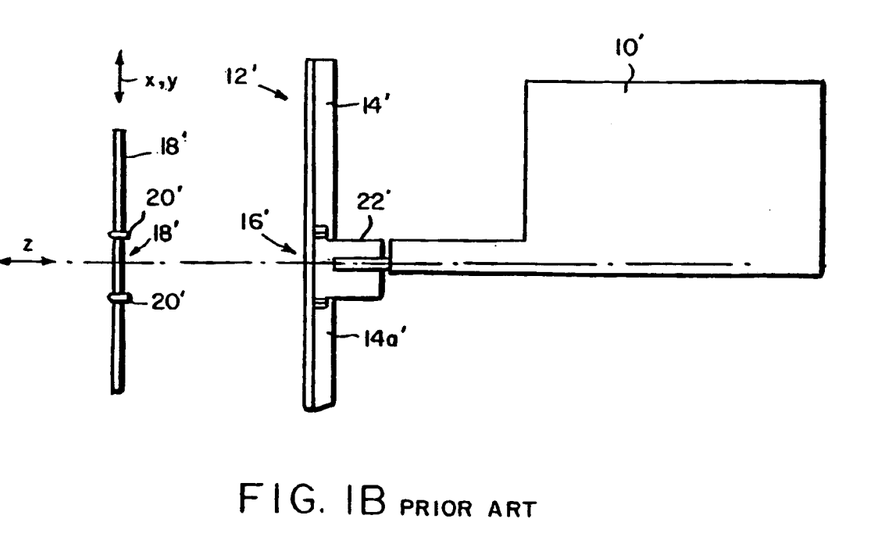

FIGS. 1A and 1B show a prior art plunge mechanism 10' of a gravity-feed test handler 12'. A succession of devices such as small outline ("SO") leadless IC's fall along a generally vertical test track 14' to a test site 16'. The plunge mechanism 10' grips the lead IC—the device under test ("DUT")—in a surrounding nest 22' when the DUT is momentarily stopped at the test site 16' (FIG. 1B). The plunge mechanism 10' transports the DUT to a test circuit 18' (FIG. 1A) shown as a printed circuit ("PC") board, also termed a DUT board. The DUT board has a set of fixed alignment pins 20' that mate in aligned openings formed in the nest 22'. The nest 22' surrounds the DUT laterally. When the plunge mechanism is at its extreme forward (test) position, as shown in FIG. 1A, the DUT held in the nest 22' is electrically connected to the test circuit, and the test is conducted. The plunge mechanism then returns to its initial position (FIG. 1B) where it releases the DUT just tested to fall along a lower test track 14a' and ultimately to one of several collection containers, depending upon the results of the test. In the meantime, the next device in the track falls to the test site 16' and the cycle of operation begins again. In the test position, a keep out area A is defined by the portions of the nest adjacent to the DUT board 18' and surrounding the DUT at the center of the nest 22'.

Figure 2A:
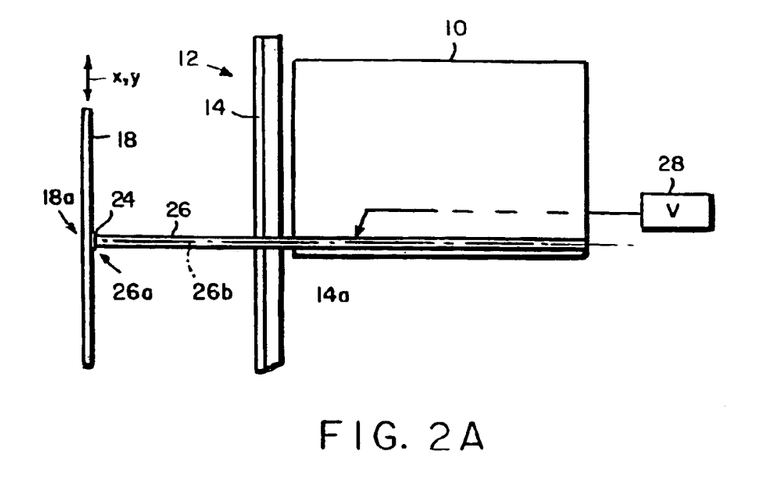
FIG. 2 is a view corresponding to FIG. 1 of a nestless plunge mechanism according to the present invention.
Figure 2B:
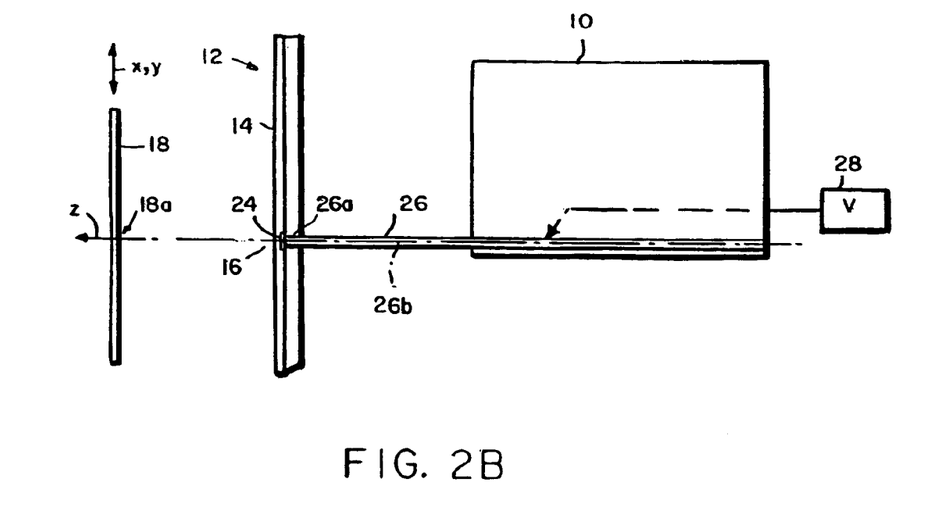

FIGS. 2A and 2B show the nestless plunge mechanism 10 of the present invention in views that correspond to prior art FIGS. 1A and 1B. Like parts in FIGS. 2A–2B are denoted with the same reference numbers used in FIGS. 1A and 1B, but without primes. In the gravity feed test handler 12 illustrated, a succession of devices 24, e.g. leadless SO chips are stacked end-to-end and move downwardly in the track 14 to the test site 16. While the devices in any run are the same, the test handler can manipulate and test electronic devices of varying type, size and with varying numbers of pins or pads for electrical connection. A DUT board 18 is positioned parallel to, and closely spaced from, the test track along the z direction. The DUT board test site 18a is very accurately aligned with the test site 16. A pair of retractable stop pins of known design, or equivalent member(s), when extended into the track defines the test site by forcing the bottom-most or lead device to a stop on the pins. In combination with the track, the stop pins precisely locates this DUT with respect to the test site on the DUT board.

A principal feature of the present invention is an elongated probe 26 fixed, preferably replaceably, at its rear end to the plunge mechanism 10. The probe 26 extends along the z direction to a tip 26a positioned with its planar end face immediately adjacent, and generally centered on, an opposed planar face of the DUT 24. The probe has a central axial bore 26b that extends from the end face of its tip 26a to a line in fluid communication with a vacuum source 28. The vacuum is sufficiently strong that when applied to the DUT via the narrow passage 26b, it grips the DUT with sufficient force to support and transport it without relative movement between the DUT 24 and the probe 26. For typical SO leadless chips currently used in computers, telecommunications equipment, and consumer electronics, the vacuum is typically 18 to 22 inches of mercury, about 10 psi.

The probe is sufficiently long in its axial or z direction that when the plunge mechanism 10 is driven from the retracted, pick-up position, shown in FIG. 2B, to a forward limit or test position, shown in FIG. 2A, the DUT carried on the tip of the probe is driven into a reliable electrical connection with electrical contacts at the test site of the DUT board 18. The probe is also sufficiently small in profile (in the x,y plane transverse to the z direction) that it does not extend laterally beyond the footprint (outermost contour of the DUT in an x,y plane) of the DUT it is carrying. In its present preferred form, the probe 26 has a cylindrical shape with a cylindrical central passage 26b. The DUT's 24 typically have rectangular or square upper and lower faces. The outer diameter of the probe 26 is therefore less than or equal to the smaller of the length or width of the DUT it carries.

As noted above, the accuracy and reliability of the test is related to the accuracy and reliability of the electrical connection between the leads or pads of the DUT and a corresponding set of electrical contacts on the DUT board, or on a socket, contactor assembly, or the like mounted on the board. In turn, the quality of the electrical connection at the test site depends on the desired alignment between the array of pins or pads on the DUT and a mating array of electrical contacts at the test site 18a. This alignment is established, first, by accurately locating the DUT at the test site 16. It is then important that the probe 26 and the plunge mechanism 10 maintain this alignment during the plunge transport of the DUT from the track test site 16 to the DUT board test site 18a. This transport and the vacuum grip must resist 1) deflection due to the force of gravity acting on the cantilevered load of the DUT at the probe, 2) vibration-induced movement, and 3) the mechanical forces acting on the DUT as it contacts, and is driven into and then out of electrical connection with, the DUT board. The exact degree of alignment that must be maintained will vary depending on factors such as the device and its pin or pad size and spacing, the test circuit, and the test parameters. The spacing between adjacent pins or pads of the DUT sets a minimum limit on the degree of control required. However, holding the lateral (x,y) position of the DUT to within 1 mil or less is a typical value for SO devices.

The presently preferred construction for the body of the probe 26 that meets these operating criteria is a needle-like member formed of 300 series stainless steel. Hypodermic syringe needle stock is suitable. The precise dimensions of the probe—its length, outer and inner diameters, and the length to outer diameter ratio—will vary depending on the application and on the material forming the probe. The probe 26 is designed to resist deflection beyond the pre-selected limit with a maximum load applied eccentrically under worse case conditions (applied at the outer radius) with a safety factor of three. Using 300 series stainless, the length-to-outer diameter ratio of the probe will vary from as small as about 10:1 (e.g. for use with large chips) to up to about 32:1 (e.g. for use with small SO leadless chips, e.g. 3 mm×3 mm with a maximum applied force of about 20 pounds—the maximum driving force of the plunge mechanism 10). By way of illustration, but not of limitation, a typical probe 26 formed of 300 series stainless steel has a length of its metal body (exclusive of its tip 26a) of 2.19 inches, an outer diameter of 0.083 inch and an inner diameter of 0.039 inch (the passage 26b), yielding a length-to-outer diameter ratio of about 26:1. The tip 26a has a like diameter central passage and is secured to the stainless body by an epoxy. Operating with a vacuum of about 10 psi, the probe 26 has been found to be very effective in transporting a range of DUT sizes and types while maintaining the desired alignment of the DUT with respect to the test site 18a.

The probe tip 26a is formed of an insulating material to control the possibility of any electrical interaction between the probe and the DUT on the test circuit that would degrade the test. Preferably the tip material is also static dissipative to control the build-up of a static electrical charge which could cause damage to the sensitive internal circuitry of the DUT if there was a sudden discharge of said charge to or through the DUT. A suitable material is the material sold by DSM Engineering Plastics under the trade designation Semitron ESD 520. Further, the flat end face of the tip 26a seats flush on the face of the DUT to promote a strong vacuum grip. The tip 26a is preferably adhered to the metallic probe body, but it can be friction fit, screwed on, or otherwise secured.

Figure 3:
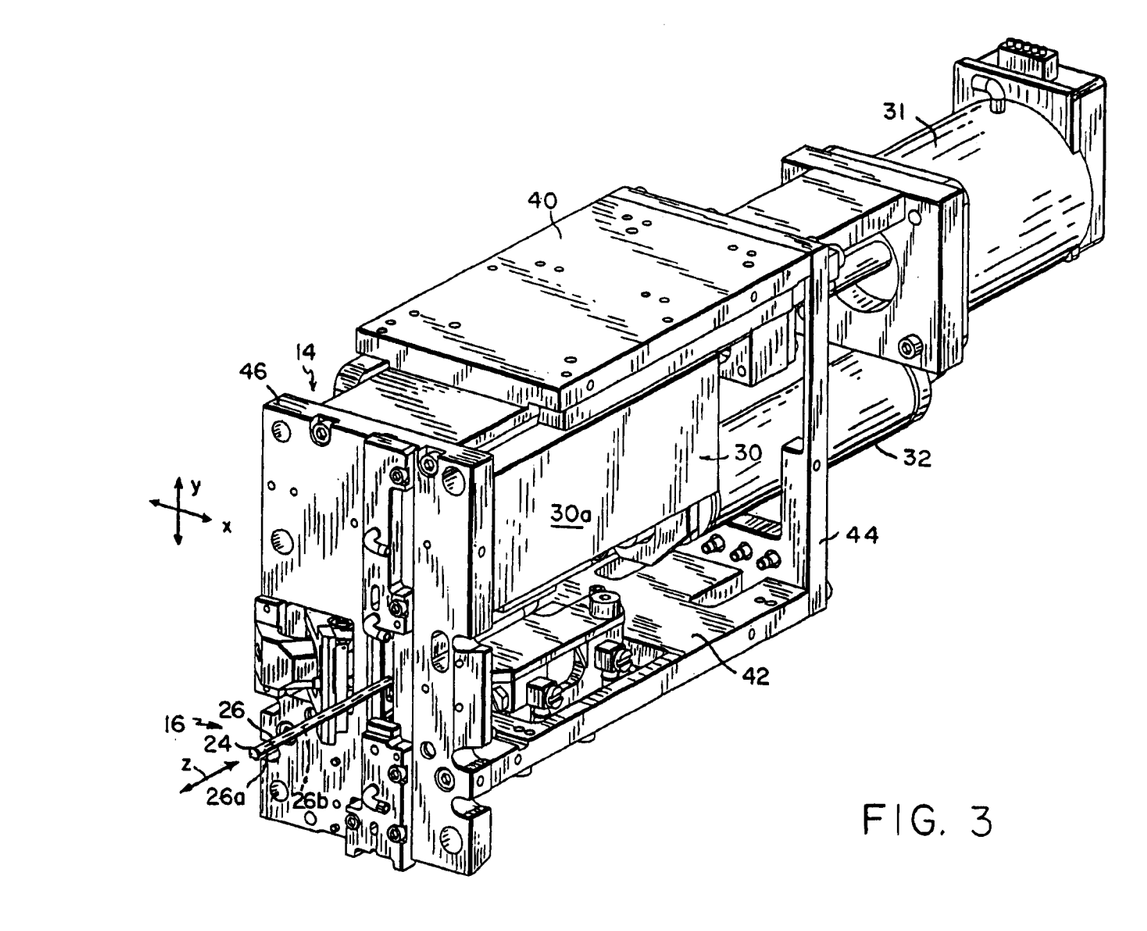
FIG. 3 is a more detailed view in perspective of the nestless plunge mechanism shown in FIG. 2.
Figure 4:
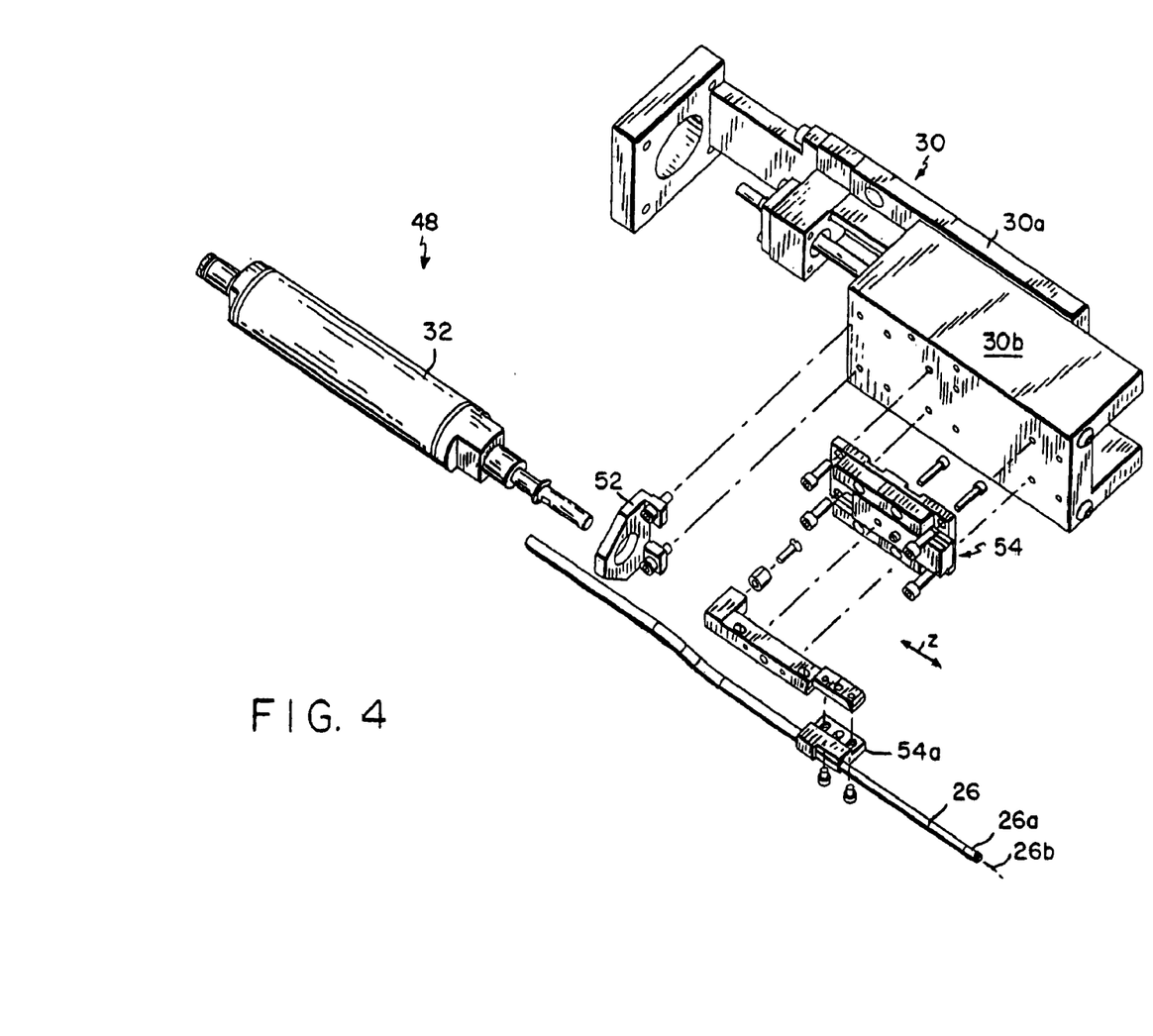
FIG. 4 is an exploded view in perspective of the plunge drive assembly shown in FIG. 3.

A linear slide 30 that incorporates precision bearings supports and guides the plunge mechanism and the attached probe 26 through their linear reciprocating movements between a retracted pick-up position (FIG. 2B) and a forward test position (FIG. 2A). As shown in FIGS. 3 and 4, the drive includes a lead screw coupled to a servomotor 31 and an air cylinder 32. The cylinder has a very limited stroke (about 0.100") and it is constantly under pressure. The pressure is adjusted to provide the desired contact force. When the DUT is driven against the DUT board 18, socket, contactor or the like, the cylinder is compressed slightly (about 0.050") thus providing the desired contact force. As will be understood by those skilled in the art, known sensors, limit switches and stops are positioned to sense the position of the plunge mechanism and coordinate its operation with other operations such as the application of the vacuum suction, an escapement mechanism for a site stop pin, and the conduct of the test. It takes about 100 msecs to plunge out or plunge back. One complete test track cycle (from the first DUT being ready to test to the second DUT being ready to test) takes about 500 msecs, with a theoretical test time of zero.

FIGS. 3 and 4 show in more detail the nestless plunge mechanism 10 shown in FIGS. 2A and 2B. Upper and lower support plates 40 and 42, together with rear support plate 44 and a forward support plate 46 (part of the vertical test track 14) together form a generally box-like support structure for the plunge mechanism 10 and its drive assembly 48. Linear slide 30 is supported within the frame. It includes a fixed member 30a, as shown in FIG. 4, and a movable component 30b with a generally C-shaped cross section driven by the servomotor 31. Precision linear bearings of this assembly ensure that the relative movement of the slide components is highly linear to within the required specifications for a given test application.

FIG. 4 (absent the servomotor 31) shows the pneumatic cylinder 32 coupled to the movable linear slide member 30b through a mounting bracket 52 and acting on a low-profile linear slide 54. The motor 31 and cylinder 32 are activated in coordination with the operation of the escapement of DUT's to the test site 16 to rapidly advance a vacuum-gripped DUT to the test site 18a and hold it in a test position with a high force, e.g. 8 to 20 lbs. The probe moves in unison with the movable slide members.

The plunge mechanism 10 and plunge transport method of the present invention provide a nestless transport to carry small semiconductor devices from a test position in a flow of such devices through a handler to electrical connection to a test circuit. It provides a high degree of repeatability and accuracy (±0.001") in the test results through the maintenance of the alignment between the contacts of the test circuit and the pins or pads on the device on the DUT independent of a nest, alignment pins, or the like. The plunge mechanism and method of the invention provide stability of the DUT during this travel and sufficient probe stiffness to resist deflections to the load carried at its tip and the forces generated as the DUT contacts the test site 18a, and is then driven into a good electrical connection at the test site. At the same time, the probe has an extremely small footprint, less than that of the DUT itself, so that there is substantially no keep out area. The DUT can be closely positioned with respect to the circuit elements of the test circuit to closely simulate end-use operating conditions.

While the invention has been described with respect to its preferred embodiments, it will be readily understood that various modifications and alterations will occur to those skilled in the art from the foregoing detailed description and accompanying drawings. For example, while the probe 26 has been described as formed from a hollow length of stainless steel tubing of generally uniform cylindrical cross-sectional configuration, the invention is not limited to this material or this configuration, either in cross section or in its uniformity along the axis of the probe. For example, the wall thickness can vary with axial length to provide additional force or resist vibration or load. The probe can have an oval or rectilinear cross section, and/or have stiffening ribs on its interior or exterior walls. Further, while the vacuum grip applied to the DUT has been described as being carried through a central axial passage through the probe 26, it will be understood that other arrangements can be utilized for applying the requisite suction force, for example, a separate vacuum feed line that feeds the tip portion 26a of the probe or a separate parallel conduit. Further, while the probe has been described as having a single central passage, it is possible to form it with multiple internal passages. It is also possible to use multiple small probes, provided that together their footprint does not exceed that of the DUT being gripped and transported. Still further, while the probe has been described with respect to a stainless steel body and a static dissipative tip, other materials can, of course, be utilized, albeit with trade-offs as to strength, corrosion resistance, electrical properties, and cost.

While the invention has been described with respect to a gravity feed handling arrangement, the principles described herein can be used in the context of pick-and-place handlers of known design, or in any handling arrangement where it is desired to move a small device from a known position into electrical connection with at test circuit or the like with a plunge movement. The drive assembly can also be implemented in a wide variety of known equivalents. The plunge drive can be, for example, affected by a solenoid. These and other variations and modifications to the invention that will occur to those skilled in the art are intended to fall within the scope of the appended claims.

What is claimed is:

1. A plunge transport mechanism for an electronic device test-handler grips and carries a device under test (DUT) in a first direction from a pick-up point to a test site where the DUT is driven into electrical connection with a test circuit via leads on the DUT that each align with and contact an associated connector at the test site, comprising:

a drive that reciprocates between a retracted and an extended position, a vacuum suction source, and an elongated probe extending generally in said first direction from one end operatively connected to said drive to a tip and moving with said drive between said retracted position and said extended position, said probe operatively connecting said vacuum source to said tip that is proximate the DUT at the pick-up point such that the DUT at said pick-up point is gripped by said vacuum suction in a fixed position with respect to said probe during the operation of said drive and probe to carry the DUT along said first direction to the test site and into electrical connection with the connectors of the test circuit.

2. The plunge transport mechanism of claim 1 wherein said drive includes a linear slide that support and maintain an alignment of the probe with the test site during the reciprocating movement.

3. The plunge transport mechanism of claim 1 wherein said probe is formed of a rigid structural material and with dimensions such that it resists deflection while gripping the DUT and through its contact with and connection to connections of the test circuit.

4. The plunge transport mechanism of claim 3 wherein said probe has a central passage along its length to connect said vacuum source to the DUT.

5. The plunge transport mechanism of claim 4 wherein said probe is formed of stainless steel and has said tip formed of an insulating, static dissipative material.

6. The plunge transport mechanism of claim 5 wherein said probe, when viewed along said first direction, lies within the footprint of the DUT.

7. The plunge transport mechanism of claim 1 wherein said probe has a length-to-diameter ratio of in the range of about 10:1 to 32:1.

8. The plunge transport mechanism of any one of claims 1 to 6 wherein said probe and test site have no alignment members that produce or maintain the alignment of the DUT with respect to said connections at the test site.

9. A method for transporting an electronic device under test (DUT) at a test site into and out of electrical connection with a fixed set of connectors of a test circuit, said transporting being in a reciprocating, plunging movement along a first direction, comprising:

providing an elongated probe extending generally in the first direction to a free end, gripping the DUT at said free end with a vacuum with sufficient force that the DUT remains in a substantially fixed position with respect to said probe during said transporting and connection, driving said probe and the vacuum gripped DUT in the first direction into the electrical connection with test circuit at the test site, and resisting a lateral deformation of the probe due to the weight of the DUT thus gripped or force developed by contact between the DUT and the connectors of the test circuit.

* * * * *

UNITED STATES PATENT AND TRADEMARK OFFICE
CERTIFICATE OF CORRECTION

PATENT NO.     : 6,864,678 B2
DATED          : March 8, 2005
INVENTOR(S)    : Charlie Ryder et al.

It is certified that error appears in the above-identified patent and that said Letters Patent is hereby corrected as shown below:

Drawings,
Fig. 3, change reference numeral "30a" to -- 30b -- as shown in the attached replacement and annotated copy of drawing sheet 3/4.

Signed and Sealed this

Twenty-sixth Day of July, 2005

JON W. DUDAS
*Director of the United States Patent and Trademark Office*

FIG. 3